April 26, 1966 J. PARSTORFER 3,247,575

METHOD FOR ENCAPSULATING ELECTRICAL COMPONENTS

Original Filed May 9, 1960 4 Sheets-Sheet 1

INVENTOR.
JOHN PARSTORFER

BY Samuel Kane

ATTORNEY

INVENTOR.
JOHN PARSTORFER
BY
Samuel Kane
ATTORNEY

April 26, 1966 J. PARSTORFER 3,247,575

METHOD FOR ENCAPSULATING ELECTRICAL COMPONENTS

Original Filed May 9, 1960 4 Sheets-Sheet 3

INVENTOR.
JOHN PARSTORFER

BY Samuel Kane
ATTORNEY

METHOD FOR ENCAPSULATING ELECTRICAL COMPONENTS

Original Filed May 9, 1960 4 Sheets-Sheet 4

INVENTOR.
JOHN PARSTORFER
BY
Samuel Kane
ATTORNEY

United States Patent Office 3,247,575

Patented Apr. 26, 1966

3,247,575

METHOD FOR ENCAPSULATING ELECTRICAL COMPONENTS

John Parstorfer, Philadelphia, Pa., assignor to Burroughs Corporation, Detroit, Mich., a corporation of Michigan

Original application May 9, 1960, Ser. No. 27,599, now Patent No. 3,084,391, dated Apr. 9, 1963. Divided and this application Aug. 1, 1962, Ser. No. 219,808
1 Claim. (Cl. 29—155.5)

This application is a division of a copending application of John Parstorfer, Serial No. 27,599, filed May 9, 1960, now Patent No. 3,084,391 and entitled "Mold for Encapsulating Electrical Components."

This invention relates generally to molding methods and more particularly to an improved method for fabricating a unitary package or assembly of electrical components such as resistors, diodes, transistors, capacitors, and the like.

An object of the invention is to provide an improved method for encapsulating or encasing electrical components.

Another object of the invention is to provide a method for fabricating an electrical assembly in which individual electrical components may be inserted and electrically interconnected in a simple and convenient manner.

A further object of the invention is to provide a molding method for encapsulating electrical components into a unitary assembly in which stresses on the components due to shrinkage of the molding compound are held to a minimum value.

Another object of the invention is to provide a method for encapsulating electrical components in which servicing of components and final testing may be performed before the components are finally molded or encapsulated into a finished product assembly.

In accordance with the above objects and considered first in its broad aspects, the invention utilizes a two-stage mold which is used in one construction in the first stage for molding a component carrier. In the second stage, electrical components are inserted into the component carrier and the carrier placed into the second-stage construction of the mold for final encapsulation of the electrical components.

The invention will be more clearly understood when the following detailed description of a specific method thereof is read in conjunction with the accompanying drawings in which.

Figure 1:
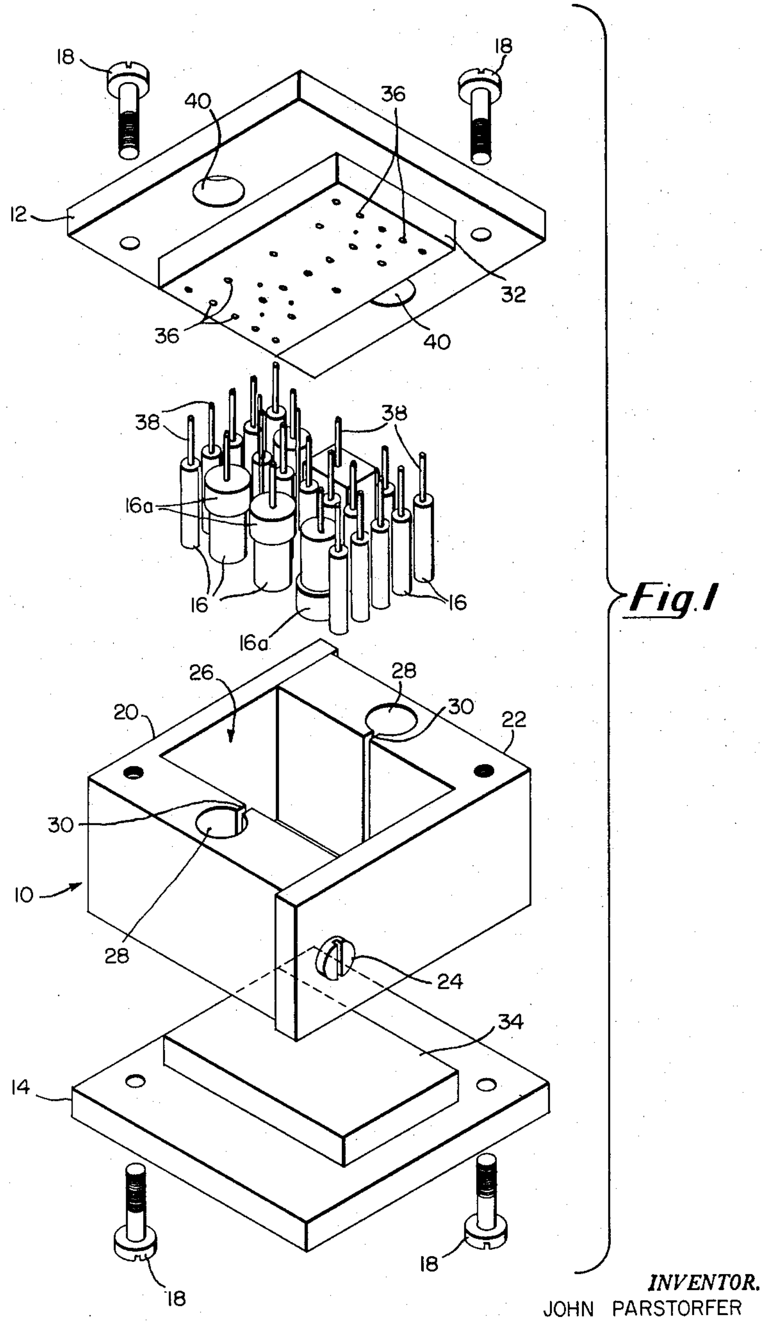
FIG. 1 is an isometric exploded or separated view of a first-stage mold constructed in accordance with the invention.

Referring now to the drawings which illustrate the preferred embodiment of a mold for practicing the invention, and particularly to FIG. 1, the first-stage part of the mold includes a cavity mold 10, a top plate 12, a bottom plate 14, a plurality of cores 16, and cap screws 18 for securing the top and bottom plates 12 and 14 to the cavity mold 10. Certain of the cores 16 may be provided with enlarged body portions 16*a*, as shown, to form counterbores in the component carrier, as will be clear hereinafter.

The cavity mold 10 comprises two angle members 20 and 22 secured together by means of two cap screws 24, only one of which is shown, to form a rectangular opening or cavity 26 extending through the cavity mold 10. Each of the angle members 20 and 22 is provided with a sprue hole 28 which communicates with cavity 26 by means of an associated slot or gate 30.

Figure 2:
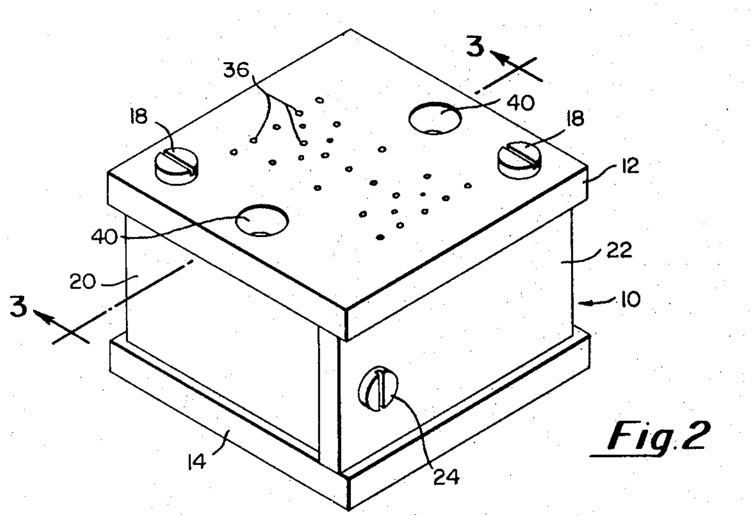
FIG. 2 is an assembly view of the mold of FIG. 1.
Figure 3:
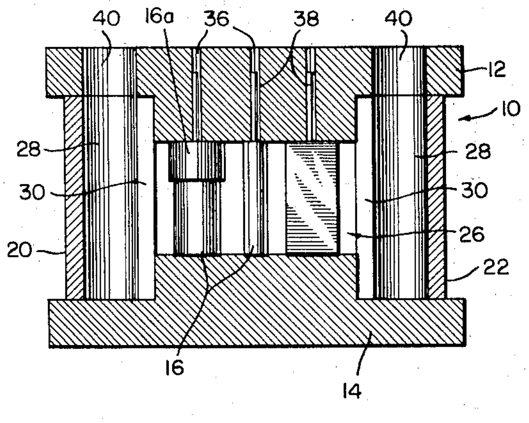
FIG. 3 is a sectional view taken along line 3—3 of FIG. 2.

The top and bottom plates 12 and 14 are similarly provided with pads 32 and 24 respectively, each pad being dimensioned to fit snugly in the cavity 26 when the mold is in the assembled condition shown in FIGS. 2 and 3. Pad 32 is provided with a plurality of apertures 36 for receiving therein the respective pilot pins 38 of the cores 16 for properly locating the cores in the cavity 26. The upper plate 12 is provided with two pouring holes 40 which are in line with the sprue holes 28 when the top plate 12 is secured to the cavity mold 10.

Figure 6:
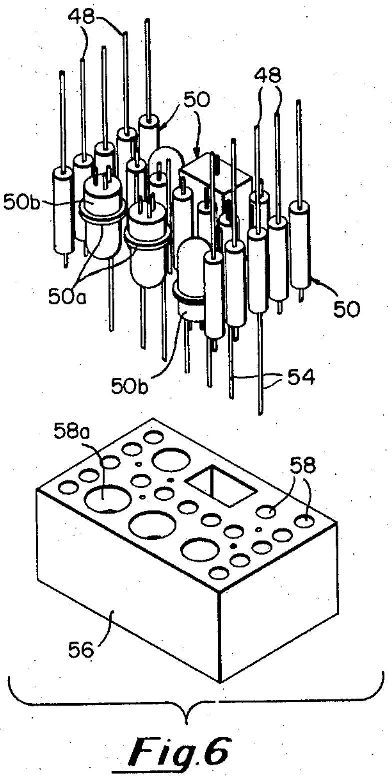
FIG. 6 is an isometric exploded or separated view showing the component carrier and electrical components, the latter being shown before they are electrically connected.
Figure 8:
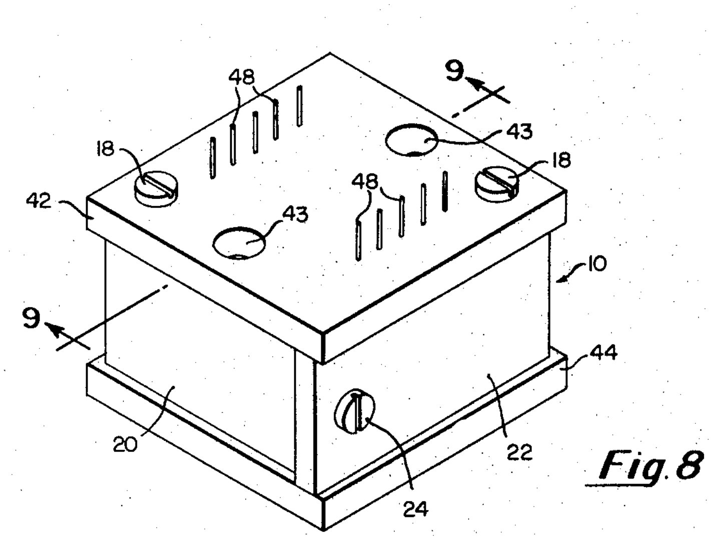
FIG. 8 is an isometric assembly view of the mold of FIG. 7 with the component carrier and electrical components in position in the mold.

The second-stage part of the mold (FIG. 7) includes the same cavity mold 10 but the top and bottom plates 12 and 14 are now replaced by top and bottom plates 42 and 44 respectively of an electrically insulating material having preferably a low coefficient of friction such, for example, as Teflon. The upper plate 42 is provided with apertures 46 for receiving therethrough the leads 48 of certain of the electrical components 50 (FIG. 6). The bottom plate 44 is similarly provided with apertures 52 for receiving therethrough leads 54 of certain of the electrical components 50.

Figure 5:
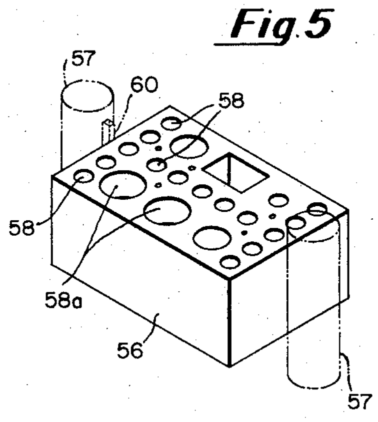
FIG. 5 is an isometric view showing the component carrier after it has been removed from the mold of FIG. 4, with sprue slugs removed but shown in phantom.
Figure 4:
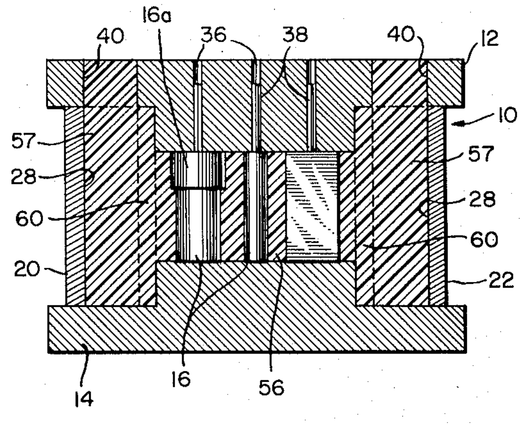
FIG. 4 is a view similar to FIG. 3 but showing the mold filled with compound in the first-stage process of forming a component carrier.
Figure 11:
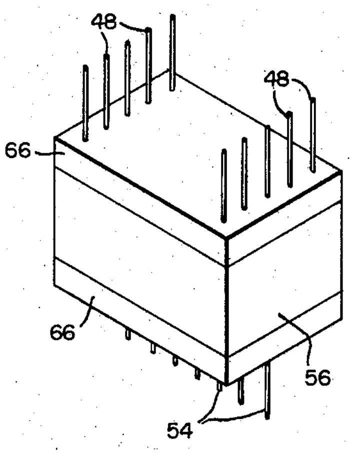
FIG. 11 shows the encapsulated electrical assembly after it has been removed from the mold of FIG. 10 and with sprue slugs removed.

The first step in the process of obtaining the final encapsulated electrical assembly shown in FIG. 11 is to mold a honeycombed component carrier 56 (FIGS. 5 and 6). This is accomplished by assembling the first-stage mold of FIG. 1 as shown in FIGS. 2 and 3 with the pilot pins 38 inserted in apertures 36 to position the cores 16 in closely spaced-apart relation in the cavity 26. A molding compound of a plastic electrically insulating material in the heated fluid state is poured into one of the pouring holes 40 and its associated sprue hole 28 until it fills the mold, as shown in FIG. 4, the opposite sprue hole 28 and pouring hole 40 serving to vent the cavity 26 during the pouring operation until they are finally filled with an excess of molding compound. After the molding compound has hardened sufficiently and while it is still hot, the bottom plate 14 is removed from the mold and the sprue slugs 57 driven upwardly, as viewed in FIG. 4, and thus severed from the component carrier 56 and removed from the mold through the pouring holes 40 of the top cover plate 12. The top cover plate 12 and cores 16 are next removed from the mold. The component carrier 56, honeycombed by the cored holes 58, is then pushed through the cavity mold 10 and the gate material 60 dressed off the component carrier. If the component carrier 56 should stick in the cavity 26, the screws 24 may be backed off slightly, or removed, to enable the component carrier 56 to be removed very easily from the cavity mold 10. In this connection, it should be noted that the two-piece construction of the cavity mold 10 (FIG. 1), including the angle members 20 and 22, not only facilitates the removal of the component carrier 56 from the cavity mold 10, but also provides a simplified cavity mold by utilizing the smallest possible number of parts.

In the second stage of the process the electrical components 50 (FIG. 6) are inserted into the respective cored holes 58 in the honeycombed component carrier 56. The dimensions of the electrical components 50 are substantially the same as the cores 16 so that they have a close fitting relation in the cored holes 58. Certain of the electrical components 50 have shoulders 50*a*, and have body portions 50*b* disposed with a slight annular clearance in the counterbores 58*a* (see also FIG. 9) formed by the enlarged body portions 16*a* of cores 16, the shoulders 50*a* resting on the bottom or inner end of the counterbores.

Figure 7:
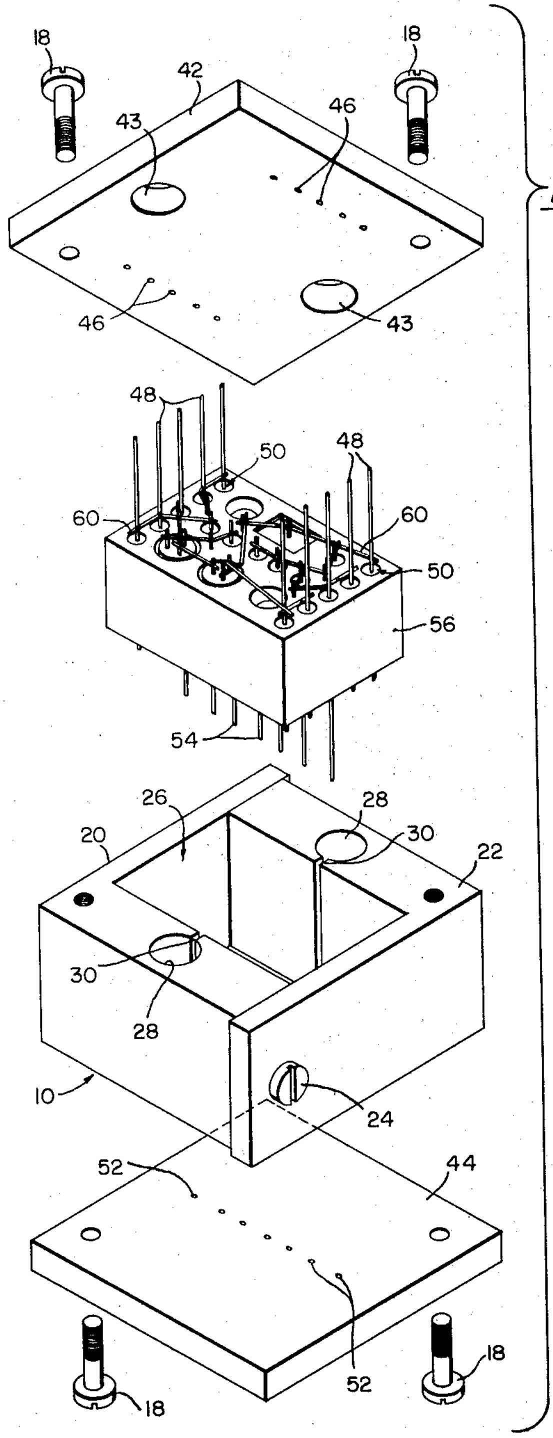
FIG. 7 is an isometric exploded or separated view of the second-stage part of the mold and showing also the electrical components assembled and electrically interconnected in the component carrier.
Figure 9:
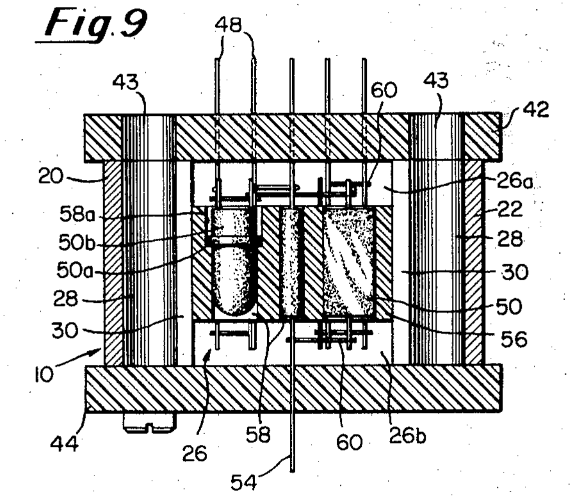
FIG. 9 is a sectional view taken along line 9—9 of FIG. 8.

The inserted electrical components 50 are then electrically connected according to the particular requirements by means of jumper wires 60 (FIG. 7). The assembled component carrier 56 is then inserted into the cavity 26 (FIG. 9) in the cavity mold 10 and the top and bottom plates 42 and 44 secured to the cavity mold 10 with the leads 48 projecting through the apertures 46 in the upper plate 42 and the leads 54 projecting through the apertures 52 in the lower plate 44. As shown in FIG. 9, the component carrier 56 is inserted into the cavity 26 to such a position as to provide upper and lower rectangular spaces 26*a* and 26*b* respectively in the cavity 26 corresponding substantially to those formerly occupied in the first-stage operation by the pads 32 and 34 (FIG. 1). Since the component carrier 56 is now inserted into the same cavity mold 10 in which it was cast, it will be held frictionally in the suspended position in the cavity mold, as shown in FIG. 9.

At this time and before final encapsulation, the electrical assembly may conveniently be tested electrically by means of the projecting leads 48 and 54 to make certain that the electrical connections were not disturbed when the component carrier 56 was outside of or while being inserted into the cavity mold 10 and when the plates 42 and 44 were applied over the lead wires 48 and 54.

Figure 10:
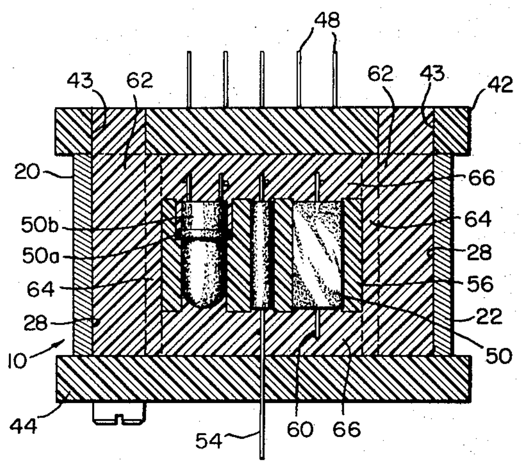
FIG. 10 is a view similar to FIG. 9 but showing the mold filled with an encapsulating material or molding compound.

To finally encapusulate the assembly, plastic electrically insulating material in the heated fluid state and preferably of the same material as the component carrier 56 is now poured into one of the pouring holes 43 in a similar manner as in the first-stage process until it fills the mold and the encapsulating spaces 26*a* and 26*b*, as shown in FIG. 10. After the molding compound has hardened sufficiently and while it is still hot, the bottom plate 44 is removed and the sprue slugs 62 removed in a similar manner as described earlier, after which the top plate 42 is removed from the mold. In this connection, it will be recalled that the top and bottom plates 42 and 44 were described earlier as being composed of a low friction insulating material. Accordingly, the operation of withdrawing them from the mold over the lead wires 48 and 54 is accomplished very smoothly.

The molded electrical assembly is next removed from the cavity mold 10 and the gate material 64 dressed off in the usual manner. The completed assembly (FIG. 11) shows that the laminae or layers of encapsulating material 66 are dimensionally coextensive with the component carrier 56 whereby there is provided an electrical package having uniform overall dimensions.

An important feature of the invention resides in the fact that the electrical components 50 are encapsulated with very little shrinkage stresses imposed on them by the encapsulating compound. This advantage is obtained by first pre-forming the component carrier 56 which, in the second-stage operation, absorbs a substantial portion of the shrinkage stresses and offers resistance to the remaining stresses which are developed only axially against the end faces of the electrical components 50. In the case of the electrical components having shoulders 50*a*, their body portions 50*b* (FIGS. 9 and 10) are surrounded laterally by a thin annular portion of encapsulating material, however, the radial stresses due to this small amount of material are negligible.

The cored holes 58 have been illustrated in the preferred embodiment of the invention as extending through the component carrier 56, however, it is within the contemplation of the invention that some or all of the cored holes may extend only partly into the component carrier.

The foregoing disclosure has set forth a specific mold structure and method for fabricating electrical components into a unitary package or assembly in which servicing and testing may be simply and conveniently performed during the molding operation, and which produces a highly reliable electrical package substantially free of stresses on the electrical components.

While there has been set forth an illustrative structure and method to exemplify the principles of the invention, it is to be understood that other constructions of the mold and deviations from the method may be resorted to without departing from the true spirit and scope of this invention. Accordingly, it is to be understood that the invention is not to be limited by the specific mold structure disclosed nor by the specific steps describing the method of the invention but only by the subjoined claim.

What is claimed is:

A method of encapsulating elongated electrical components each having at least one lead extending from at least one end face thereof comprising forming in a mold a single block of electrical insulating material with a plurality of elongated holes, each said hole having a transverse dimension which is substantially the same as the transverse dimension of the body portion of an associated electrical component thereby providing a close fitting relation with said body portion, removing said block of electrical insulating material from the mold and inserting said components into the respective associated holes with at least one of said end faces of each component exposed and substantially flush with a face of said block, electrically connecting certain of said leads closely adjacent to said face of the block, placing the electrically connected block assembly back into the same mold and applying electrical insulating material in fluid form on said face of the block to cover said end face portions of the electrical components and the electrically connected portions of said leads, and allowing said electrical insulating material in fluid form to harden, whereby the hardened electrical insulating material forms at least one lamina which is coextensive with said block and which has the same transverse dimensions, said electrical insulating material in fluid form coming into contact only with said end face portions of the electrical components and not with said body portions thereof.

References Cited by the Examiner

UNITED STATES PATENTS

| | | | |
|---|---|---|---|
| 2,774,052 | 12/1956 | Flour | 29—155.5 |
| 2,862,992 | 12/1958 | Franz | 29—155.5 |
| 2,871,548 | 2/1959 | Pisani | 29—155.5 |
| 2,902,628 | 9/1959 | Leno | 29—155.5 |
| 2,994,806 | 8/1961 | McLaughlin | 317—99 |
| 3,027,627 | 4/1962 | Sturdy | 29—155.5 |

JOHN F. CAMPBELL, *Primary Examiner.*

WHITMORE A. WILTZ, *Examiner.*

J. W. BOCK, P. M. COHEN, *Assistant Examiners.*